United States Patent
Su et al.

(10) Patent No.: US 9,967,086 B2
(45) Date of Patent: May 8, 2018

(54) FREQUENCY MODULATION RECEIVER AND FREQUENCY MODULATION RECEIVING METHOD

(71) Applicant: MStar Semiconductor, Inc., Hsinchu Hsien (TW)

(72) Inventors: Yu-Che Su, Hsinchu Hsien (TW); Kuan-Chou Lee, Hsinchu Hsien (TW); Tai-Lai Tung, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days. days.

(21) Appl. No.: 15/397,861

(22) Filed: Jan. 4, 2017

(65) Prior Publication Data

US 2018/0006800 A1    Jan. 4, 2018

(30) Foreign Application Priority Data

Jul. 1, 2016  (TW) .............................. 105120907 A

(51) Int. Cl.
| | |
|---|---|
| *H04L 7/033* | (2006.01) |
| *H04L 27/227* | (2006.01) |
| *H04L 27/00* | (2006.01) |
| *H04L 27/14* | (2006.01) |
| *H03L 7/093* | (2006.01) |

(52) U.S. Cl.
CPC .......... *H04L 7/0331* (2013.01); *H04L 27/227* (2013.01); *H03L 7/093* (2013.01); *H04L 27/14* (2013.01); *H04L 2027/0067* (2013.01)

(58) Field of Classification Search
CPC .... H03L 7/093; H03D 1/2236; H04B 1/1646; H04L 7/0331; H04L 27/227; H04L 2027/0067; H04L 27/14
See application file for complete search history.

(56) References Cited

U.S. PATENT DOCUMENTS

| | | | | |
|---|---|---|---|---|
| 4,860,354 | A | * | 8/1989 | van Roermund .... H03D 1/2236 331/25 |
| 5,517,686 | A | * | 5/1996 | Kennedy ................ H04B 1/126 455/273 |
| 5,572,558 | A | * | 11/1996 | Beherns ........... G11B 20/10037 375/350 |

(Continued)

FOREIGN PATENT DOCUMENTS

| | | |
|---|---|---|
| CN | 100459415 C | 2/2009 |
| CN | 101776861 A | 7/2010 |

(Continued)

*Primary Examiner* — Sophia Vlahos
(74) *Attorney, Agent, or Firm* — Edell, Shapiro & Finnan, LLC

(57) ABSTRACT

A frequency modulation receiver includes a frequency modulation demodulation circuit that generates a first signal, and a phase locked loop (PLL) circuit coupled to the frequency modulation demodulation circuit to receive the first signal. The PLL circuit includes: a voltage-controlled oscillator (VCO), generating an oscillation output signal according to a filtered output signal; a phase detector, coupled to the VCO, generating a phase signal according to the oscillation output signal and the first signal; and a proportional-integral-derivative (PID) filter, coupled to the VCO and the phase detector, receiving the phase signal and generating the filtered output signal to the VCO.

6 Claims, 10 Drawing Sheets

(56) References Cited

U.S. PATENT DOCUMENTS

| | | | | |
|---|---|---|---|---|
| 6,351,631 | B1* | 2/2002 | Noeske | H03L 7/081 |
| | | | | 348/E5.125 |
| 2007/0047737 | A1* | 3/2007 | Lerner | H04H 40/54 |
| | | | | 381/22 |
| 2009/0243735 | A1* | 10/2009 | Luiz | H03L 7/093 |
| | | | | 331/1 A |
| 2012/0176201 | A1* | 7/2012 | Ganesh | H03L 7/085 |
| | | | | 331/17 |
| 2015/0015308 | A1* | 1/2015 | Da Dalt | H03L 7/093 |
| | | | | 327/106 |

FOREIGN PATENT DOCUMENTS

| | | |
|---|---|---|
| CN | 101986569 A | 3/2011 |
| CN | 103427866 A | 12/2013 |

\* cited by examiner

FREQUENCY MODULATION RECEIVER AND FREQUENCY MODULATION RECEIVING METHOD

This application claims the benefit of Taiwan application Serial No. 105120907, filed Jul. 1, 2016, the subject matter of which is incorporated herein by reference.

BACKGROUND OF THE INVENTION

Field of the Invention

The invention relates in general to a frequency modulation receiver and a frequency modulation receiving method, and more particularly to a frequency modulation receiver and a frequency modulation receiving method capable of converging promptly and achieving a lower mean square error.

Description of the Related Art

Stereo-phonic frequency modulation (FM) systems are extensively applied in the daily life. A stereo-phonic frequency modulation system uses a phase locked loop (PLL) circuit to track a frequency or a phase of a pilot signal, and accordingly generates an oscillation output signal. A stereo-phonic frequency modulation receiver may then obtain separate left-channel signal and right-channel signal according to the oscillation output signal.

In general, a conventional PLL circuit uses a loop filter to generate a filtered output signal, and further uses a voltage-controlled oscillator (VCO) to generate an oscillation output signal according to the filtered output signal generated by the loop filter. It should be noted that, a conventional PLL circuit that uses a loop filter needs a longer period of time to track the frequency or phase of a pilot signal. In other words, the oscillation output signal cannot promptly and accurately track the frequency or phase of a pilot signal, in a way that a stereo-phonic frequency modulation receiver may not accurately obtain the separate right-channel signal and left-channel signal.

Therefore, there is a need for a frequency modulation receiver and a frequency modulation receiving method capable of converging promptly and achieving a low mean square error.

SUMMARY OF THE INVENTION

The invention is directed to a frequency modulation receiver and a frequency modulation receiving method capable of converging promptly and achieving a low mean square error.

The present invention discloses a frequency modulation receiver. The frequency modulation receiver includes: a frequency modulation demodulation circuit, generating a first signal; and a phase locked loop (PLL) circuit, coupled to the frequency modulation demodulation circuit to receive the first signal. The PLL circuit includes: a voltage-controlled oscillator (VCO), generating an oscillation output signal according to a filtered output signal; a phase detector, coupled to the VCO, generating a phase signal according to the oscillation output signal and the first signal; and a proportional-integral-derivative (PID) filter, coupled to the VCO and the phase detector, receiving the phase signal and generating the filtered output signal to the VCO. The PID filter includes: a proportion circuit, multiplying the phase signal by a proportion coefficient to generate a proportion result; an integration circuit, performing an integration calculation on the phase signal and multiplying the integration calculation result by an integration coefficient to generate an integration result; a differentiation circuit, performing a differentiation calculation on the phase signal and multiplying the differentiation calculation result by a differentiation coefficient to generate a differentiation result; and a summation circuit, generating the filtered output signal according to the proportion result, the integration result and the differentiation result.

The present invention further discloses a frequency modulation receiving method, which is applied to a frequency modulation receiver to track a frequency or a phase of a single-tone signal of a first signal. The frequency modulation receiver includes a frequency modulation demodulation circuit and a phase locked loop (PLL) circuit. The PLL circuit includes a voltage-controlled oscillator (VCO) and a phase detector. The frequency modulation receiving method includes: generating the first signal by the frequency modulation demodulation circuit; generating a phase signal according to the first signal and an oscillation output signal generated by the VCO; multiplying the phase signal by a proportion coefficient to generate a proportion result; performing an integration calculation on the phase signal and multiplying the integration calculation result by an integration coefficient to generate an integration result; performing a differential calculation on the phase signal and multiplying the differentiation calculation result by a differentiation coefficient to generate a differentiation result; adding the proportion result, the integration result and the differentiation result to generate a filtered output signal; and generating the oscillation output signal according to the filtered output signal by the VCO. The PLL circuit approximates the frequency or the phase of the single-tone signal according to the oscillation output signal.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
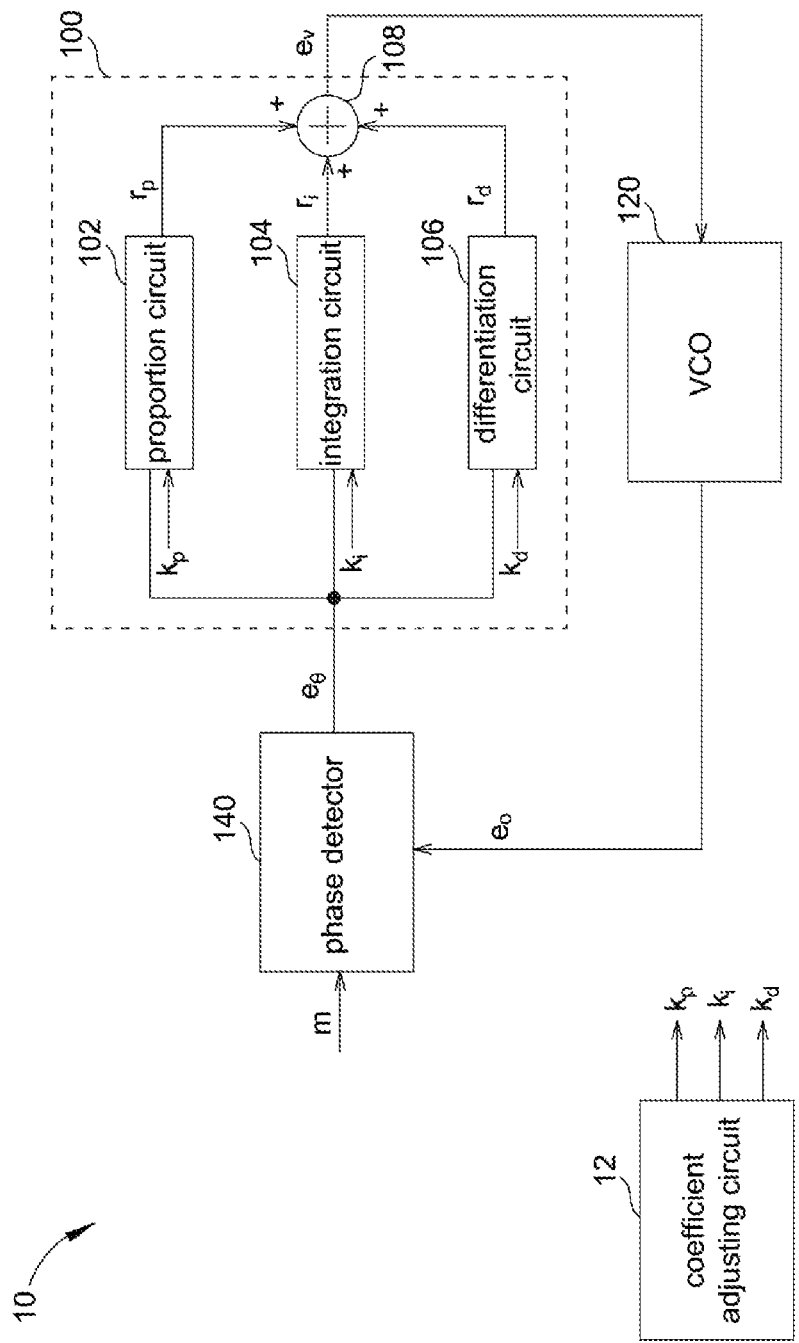
FIG. 1 is a block diagram of a phase locked loop (PLL) circuit according to an embodiment of the present invention.

FIG. 1 shows a block diagram of a phase locked loop (PLL) circuit 10 according to an embodiment of the present invention. The PLL circuit 10 includes a voltage-controlled oscillator (VCO) 120, a phase detector 120 and a filter circuit 100. The phase detector 140 generates a phase signal $e_\theta$ according to a signal m (i.e., a first signal) and an oscillation output signal $e_o$ generated by the VCO 120. The filter circuit 100 receives and processes the phase signal $e_\theta$ to generate a filtered output signal $e_v$. The VCO 120 generates the oscillation output signal $e_o$ according to the filtered output signal $e_v$. The structure of the VCO 120 is generally known to one person skilled in the art, and shall be omitted herein.

The PLL circuit 10 locks a frequency $f_p$ or a phase $\varphi_p$ of a single-tone signal in the signal m. The phase signal $e_\theta$ includes a frequency difference and a phase difference between the single-tone signal in the signal m and the oscillation output signal $e_o$. When the PLL circuit 10 starts operating, the phase signal $e_\theta$ gradually converges to 0. That is, after the PLL circuit 10 has operated for a period of time, an absolute value $|e_\theta|$ of the phase signal $e_\theta$ becomes smaller than a predetermined value $\epsilon$. The faster the phase signal $e_\theta$ converges to 0, the better the convergence speed the PLL circuit 10 provides. In other words, the PLL circuit 10 has a better frequency tracking capability or phase tracking capability for the single-tone signal in the signal m.

To enable the PLL circuit 10 to have a better frequency tracking capability or phase tracking capability, the PLL circuit 10 uses a proportional-integral-derivative (PID) filter as a filter structure of the filter circuit 100, i.e., the filter circuit 100 is a PID filter. The filter circuit 100 includes a proportion circuit 102, an integration circuit 104, a differentiation circuit 106, and a summation circuit 108. The proportion circuit 102 multiplies the phase signal $e_\theta$ by a proportional coefficient $k_p$ to generate a proportional result $r_p$. The integration circuit 104 performs an integration calculation on the phase signal $e_\theta$ and multiplies the integration calculation result by an integration coefficient $k_i$ to generate an integration result $r_i$. The differentiation circuit 106 performs a differentiation calculation on the phase signal ee and multiplies the differentiation calculation result by a differentiation coefficient $k_d$ to generate a differentiation result $r_d$. The summation circuit 108 adds up the proportion result $r_p$, the integration result $r_i$ and the differentiation result $r_d$ to generate the filtered output signal $e_v$, which is the sum of the proportion result $r_p$, the integration result $r_i$ and the differentiation result $r_d$. In brief, the PLL circuit 10, by using the filter circuit 100 having a PID filter structure, provides a better frequency tracking capability or phase tracking capability.

Figure 2:
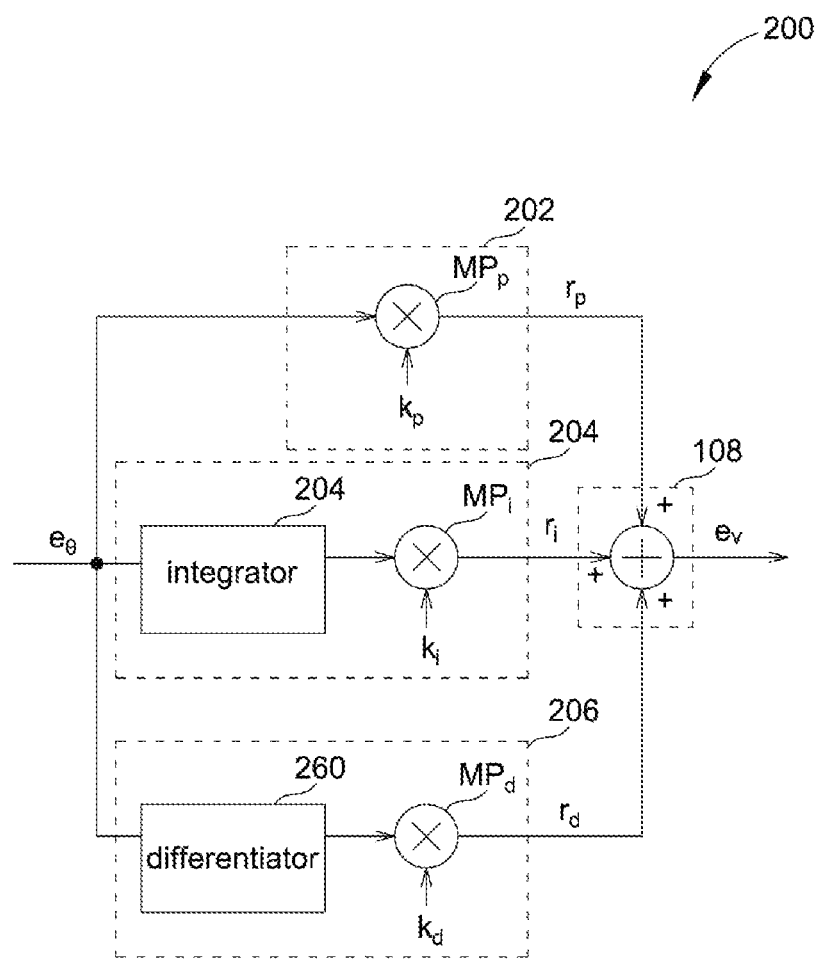
FIG. 2 is a block diagram of a filter circuit according to an embodiment of the present invention.
Figure 3:
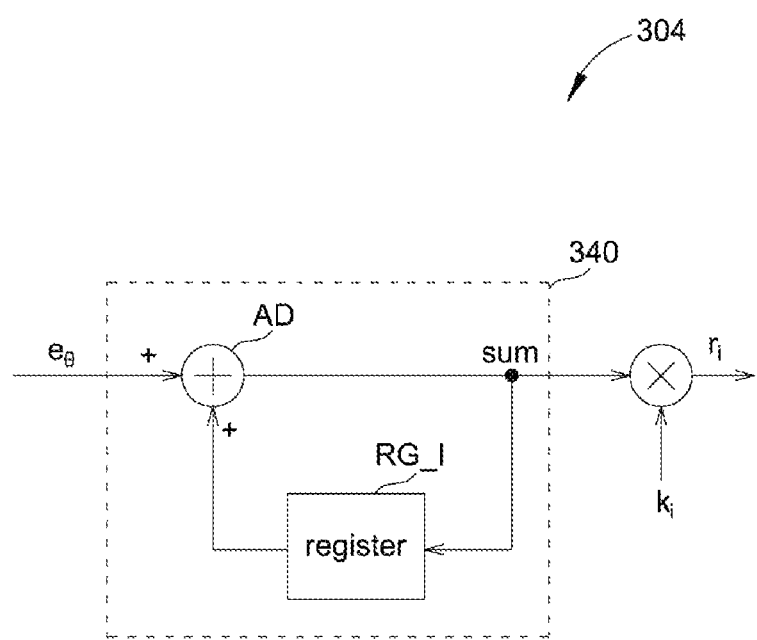
FIG. 3 is a block diagram of an integration circuit according to an embodiment of the present invention.
Figure 4:
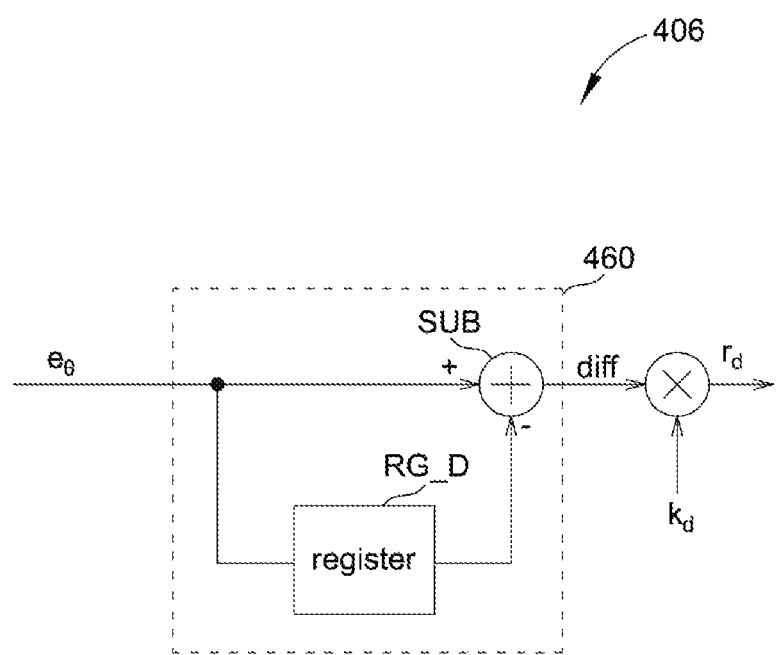
FIG. 4 is a block diagram of a differentiation circuit according to an embodiment of the present invention.

Details of the filter circuit 100 are given with reference to FIG. 2 to FIG. 4 below. FIG. 2 shows a block diagram of a filter circuit 200 according to an embodiment of the present invention. FIG. 3 shows a block diagram of an integration circuit 304 according to an embodiment of the present invention. FIG. 4 shows a block diagram of a differentiation circuit 406 according to an embodiment of the present invention. The filter circuit 200 has a structure substantially similar to that of the filter circuit 100, and may realize the filter circuit 100. The filter circuit 200 includes a proportion circuit 202, an integration circuit 204, a differentiation circuit 206 and a summation circuit 108. The proportion circuit 202 includes a multiplier $MP_p$, which multiplies a phase signal $e_\theta$ by a proportional coefficient $k_p$ to generate a proportional result $r_p$. The integration circuit 204 includes an integrator 240 and a multiplier $MP_i$. The integrator 240 performs an integration calculation on the phase signal ee, and the multiplier $MP_i$ multiplies the integration calculation result by an integration coefficient $k_i$ to generate an integration result $r_i$. The differentiation circuit 206 includes a differentiator 260 and a multiplier $MP_d$. The differentiator 260 performs a differentiation calculation on the phase signal $e_\theta$, and multiplier $MP_d$ multiplies the differentiation calculation result by a differentiation coefficient $k_d$ to generate a differentiation result $r_d$.

The integrator 240/differentiator 260 may be realized by a digital circuit. As shown in FIG. 3, the integration circuit 304 further includes a digital integrator 340, which includes a register RG_I and an adder AD. The adder AD adds a first buffered output signal generated by the register RG_I with the phase signal $e_\theta$ to generate an addition result sum. The register RG_I buffers the addition result sum in the register RG_I in a $(\lambda-1)^{th}$ clock cycle, and, in a $k^{th}$ clock cycle, outputs the addition result sum stored in the register RG_I in the $(k-1)^{th}$ clock cycle (i.e., the first buffered output signal) to the adder AD. As such, the addition result sum represents an integration calculation result that the digital integrator 340 performs on the phase signal $e_\theta$, and the integration circuit 304 multiplies the addition result sum by the integration coefficient $k_i$ to generate the integration result $r_i$.

Similarly, the differentiation circuit 406 includes a digital differentiator 460, which includes a buffer RG_D and a subtractor SUB. The buffer RG_D buffers the phase signal ee in the register RG_D in the $(k-1)^{th}$ clock cycle, and, in the $k^{th}$ clock cycle, outputs the phase signal ee stored in the register RG_D in the $(k-1)^{th}$ clock cycle (i.e., the second buffered output signal) to the subtractor SUB. In the $k^{th}$ clock cycle, the subtractor SUB may substrate the phase signal $e_\theta$ of the $(k-1)^{th}$ clock cycle (i.e., the second buffered output signal) from the phase signal $e_\theta$ of the $k^{th}$ clock cycle to generate a subtraction signal diff. As such, the subtraction signal diff represents a differentiation calculation result that the digital differentiator 460 performs on the phase signal $e_\theta$, and the differentiator 406 may then multiply the subtraction signal diff by the differentiation coefficient $k_d$ to generate the differentiation result $r_d$.

It should be noted that, the integrator 240/differentiator 260 is not limited to being realized by a digital circuit. Alternatively, the integrator 240/differentiator 260 may also be realized by an analog circuit (e.g., an RC integrator/an RC differentiator), which is also encompassed within the scope of the present invention.

Known from the above discussion, the PLL circuit 10 is enabled to have a better frequency tracking capability by using the filter circuit 100 having a PID filter structure. When the phase signal $e_\theta$ is larger (particularly when the PLL circuit 10 is about to start to operate), the proportion result $r_p$ in the filtered output signal $e_v$ may increase a variance in the frequency of the oscillation output signal $e_o$ in the next time interval, such that the frequency of the oscillation output signal $e_o$ generated by the VCO 120 promptly approximates the frequency $f_p$ of the single-tone signal in the signal m, thereby accelerating the convergence speed of the PLL circuit 10. On the other hand, during the tracking process of the PLL circuit 10, the differentiation result rd in the filtered output signal $e_v$ may accelerate or alleviate/suppress the variance in the frequency of the oscillation output signal $e_o$ in the next time interval, so as to accelerate the convergence speed and at the same time prevent the frequency of the oscillation output signal $e_o$ from excessively tracking the frequency $f_p$ of the single-tone signal in the signal m that may then cause an even longer convergence time. In comparison, the filter circuit of a conventional PLL is formed by one single loop filter. That is to say, a filtered output signal of a conventional PLL circuit contains only an integration result of the phase signal, and the variance in the frequency of an oscillation output signal in each time interval cannot be adaptively or accurately adjusted based on tracking conditions, in a way that the convergence speed of such conventional PLL circuit is slower. In brief, because the filtered output signal $e_v$ generated by the filter circuit 100 of the PLL circuit 10 according to the embodiment of the present invention further includes the proportion result $r_p$ and the differentiation result $r_d$, the PLL circuit 10 has a better frequency tracking capability compared to known technologies.

Figure 7:
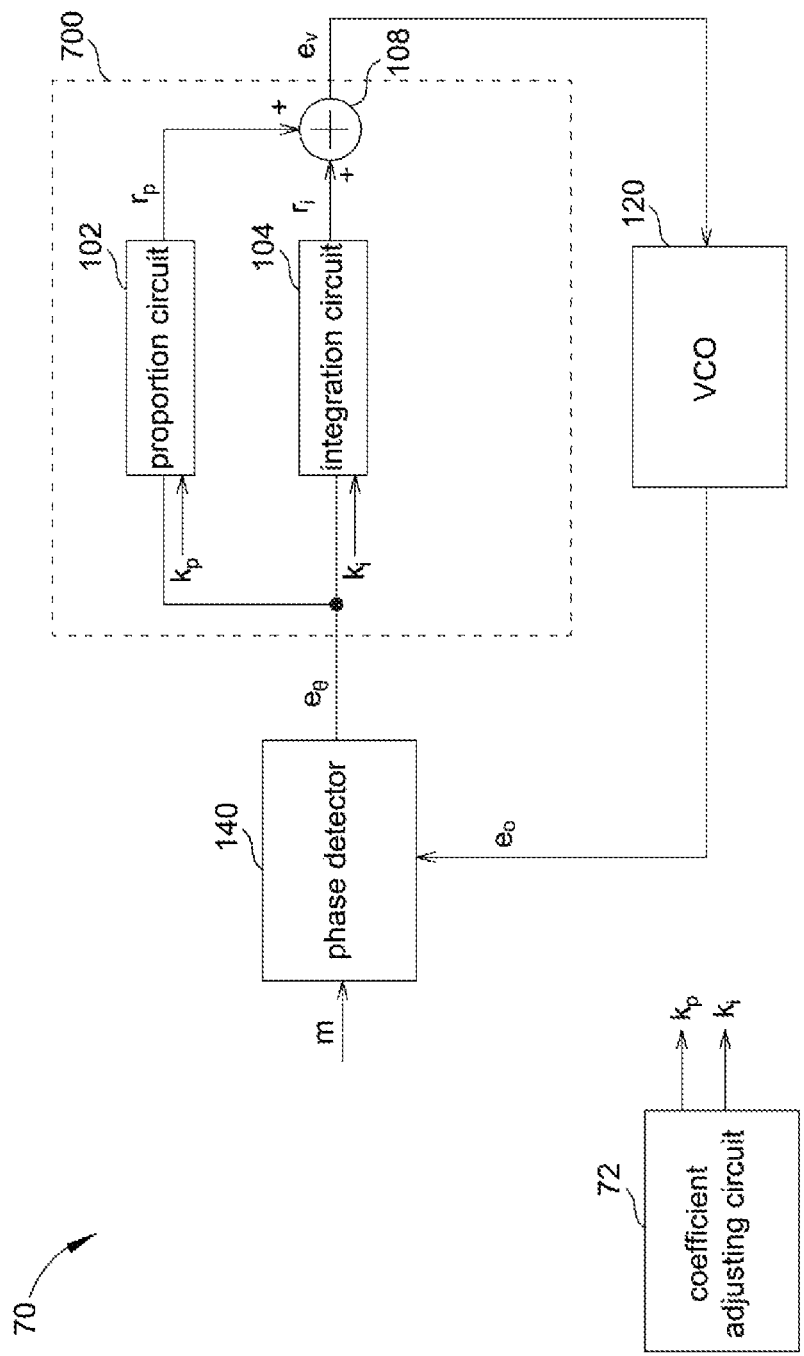
FIG. 7 is a block diagram of a coefficient adjusting circuit according to an embodiment of the present invention.

The PLL circuit 10 further includes a coefficient adjusting circuit 12. The coefficient adjusting circuit 12 may selectively adjust the proportion coefficient $k_p$, the integration coefficient $k_i$ and the differentiation coefficient $k_d$ after the PLL circuit 10 operates for a predetermined period. In one embodiment, the coefficient adjusting circuit 12 may output the proportion coefficient $k_p$, the integration coefficient $k_i$ and the differentiation coefficient $k_d$ having larger values in a first phase, and reduce the proportion coefficient $k_p$, the integration coefficient $k_i$ and the differentiation coefficient IQ in a second phase, i.e., outputting the proportion coefficient $k_p$, the integration coefficient $k_i$ and the differentiation coefficient $k_d$ having smaller values, so that the PLL circuit 10 has a better convergence effect. Associated details of the performance of frequency tracking are to be described shortly. In one embodiment, the coefficient adjusting circuit 12 may include a counter 70 and a memory 72, as shown in FIG. 7. The memory 72 stores the proportion coefficient $k_p$, the integration coefficient $k_i$ and the differentiation coefficient $k_d$ needed in the first phase and the second phase. When a counter value of the counter 70 is greater than a threshold, the coefficient adjusting circuit 12 replaces the proportion coefficient $k_p$, the integration coefficient $k_i$ and the differentiation coefficient $k_d$ originally provided in the first phase with the proportion coefficient $k_p$, the integration coefficient $k_i$ and the differentiation coefficient $k_d$ of the second phase, and provides the proportion coefficient $k_p$, the integration coefficient $k_i$ and the differentiation coefficient $k_d$ of the second phase to the PID filter.

Figure 5:
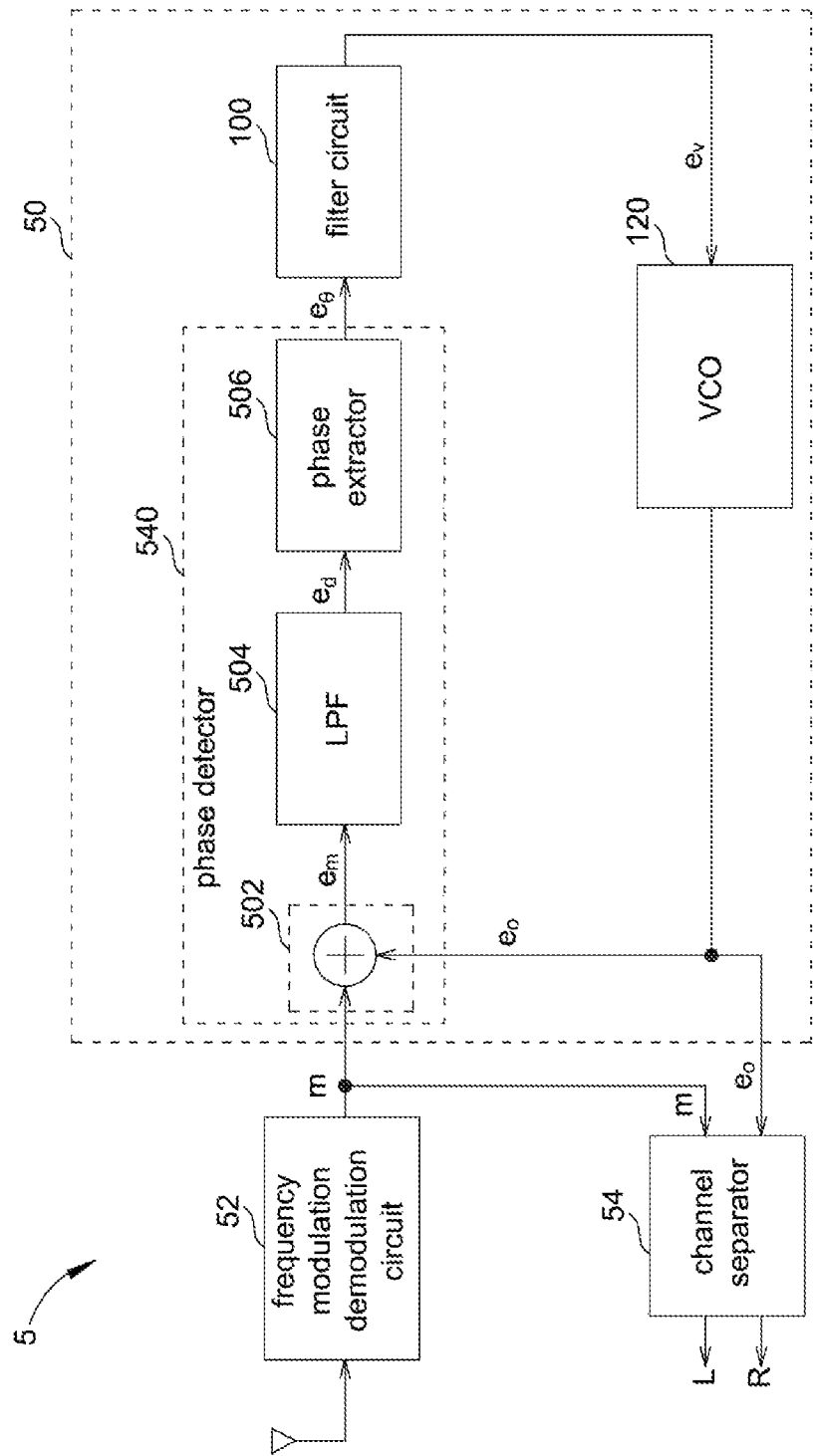
FIG. 5 is a block diagram of a frequency modulation receiver according to an embodiment of the present invention.

Further, the PLL circuit 10 may be applied in a frequency modulation (FM) receiver. FIG. 5 shows a block diagram of a frequency modulation receiver 5 according to an embodiment of the present invention. The frequency modulation receiver 5 may be a stereo-phonic frequency modulation receiver, and includes a frequency modulation demodulation circuit 52, a PLL circuit 52 and a channel separator 54. The frequency modulation demodulation circuit 52 receives a reception signal x from an antenna of the frequency modulation receiver 5, and generates a frequency modulation demodulated signal m according to the reception signal x. The signal m includes a single-tone pilot signal. The PLL circuit 50 may lock/track a frequency $f_p$ or a phase $\varphi_p$ of the pilot signal and generate an oscillation output signal $e_o$. The channel separator 54 may separate the signal m into a left-channel signal L and a right-channel signal R according to the oscillation output signal $e_o$.

Figure 6:
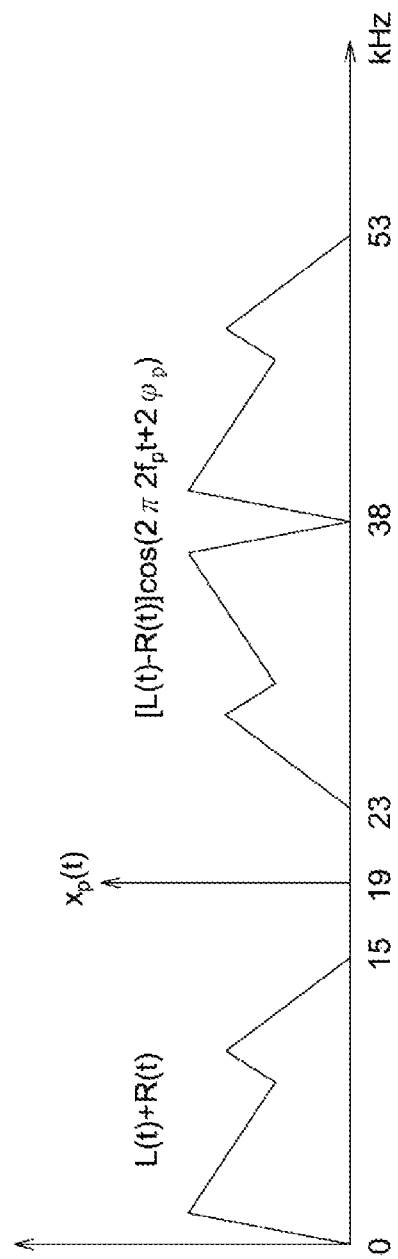
FIG. 6 is a schematic diagram of a spectrum of a signal.

More specifically, the frequency modulation demodulation circuit 52 may include a superheterodyne receiver. Operation principles are generally known to one person skilled in the art, and shall be omitted herein. For stereo-phonic frequency modulation (given that channel effect and noise are omitted), a time function of the signal m may be represented as $m(t)=[L(t)+R(t)]+x_p(t)+[L(t)-R(t)] \cos(2\pi 2f_p t+2\varphi_p)$, where $L(t)$ and $R(t)$ respectively represent time functions of the left-channel signal L and the right-channel signal R, $x_p(t)$ is the time function of a (single-tone) pilot signal, the pilot signal $x_p(t)$ may be represented as $x_p(t)=A_p \cos(2\pi f_p t+\varphi_p)$, and $A_p$, $f_p$ and $\varphi_p$ respectively represent the amplitude, frequency and phase of the pilot signal $x_p(t)$. Further, the spectrum of the signal m(t) may be as shown in FIG. 6. In general, the spectrum of $L(t)+R(t)$ are substantially located between 0 KHz and 15 KHz, the spectrum of the pilot signal $x_p(t)$ is substantially located at 19 KHz, and the spectrum of $[L(t)-R(t)] \cos(2\pi 2f_p t+2\varphi_p)$ is substantially located between 23 KHz and 53 KHz.

Further, the PLL circuit 50 tracks/locks the phase $f_p$ and phase $\varphi_p$ of the pilot signal $x_p(t)$, and thus includes a phase detector 540. The phase detector 540 includes a mixer 502, a low-pass filter (LPF) 504 and a phase extractor 506. The mixer 502 multiplies the signal m by the oscillation output signal $o_e$ to generate a mixed result $e_m$. The time function of the mixed result $e_m$ may be represented as $e_m(t)=m(t) e_o(t)$, where $e_o(t)$ represents the time function of the oscillation output signal $e_o$, the oscillation output signal $e_o(t)$ may be represented as $e_o(t)=A_o \cos(2\pi f_o t+\varphi_o)$, and $A_o$, $f_o$ and $\varphi_o$ respectively represent the amplitude, frequency and phase of the oscillation output signal $e_o(t)$. After the signal m is mixed, the spectrum of the pilot signal $x_p(t)$ shifts to near the baseband, and the LPF 504 may then filter out signal components other than the baseband from the mixed result $e_m$ to generate a low-frequency signal $e_d$. The time function of the low-frequency signal $e_d$ may be represented as $e_d(t)=A_p A_o \cos[2\pi(f_p-f_o)t+(\varphi_p-\varphi_o)]$. The phase extractor 506 extracts the phase of the low-frequency signal $e_d$ to generate the phase signal $e_\theta$. The time function of the phase signal $e_\theta$ may be represented as $e_\theta(t)=2\pi(f_p-f_o)t+(\varphi_p-\varphi_o)$. Other details of the PLL circuit 50 are identical to those of the PLL circuit 10, and shall be omitted herein. The PLL circuit 50 may then generate the oscillation output signal $e_o$, so as to promptly track/lock the frequency $f_p$ and phase $\varphi_p$ of the pilot signal $x_p(t)$.

Figure 10:
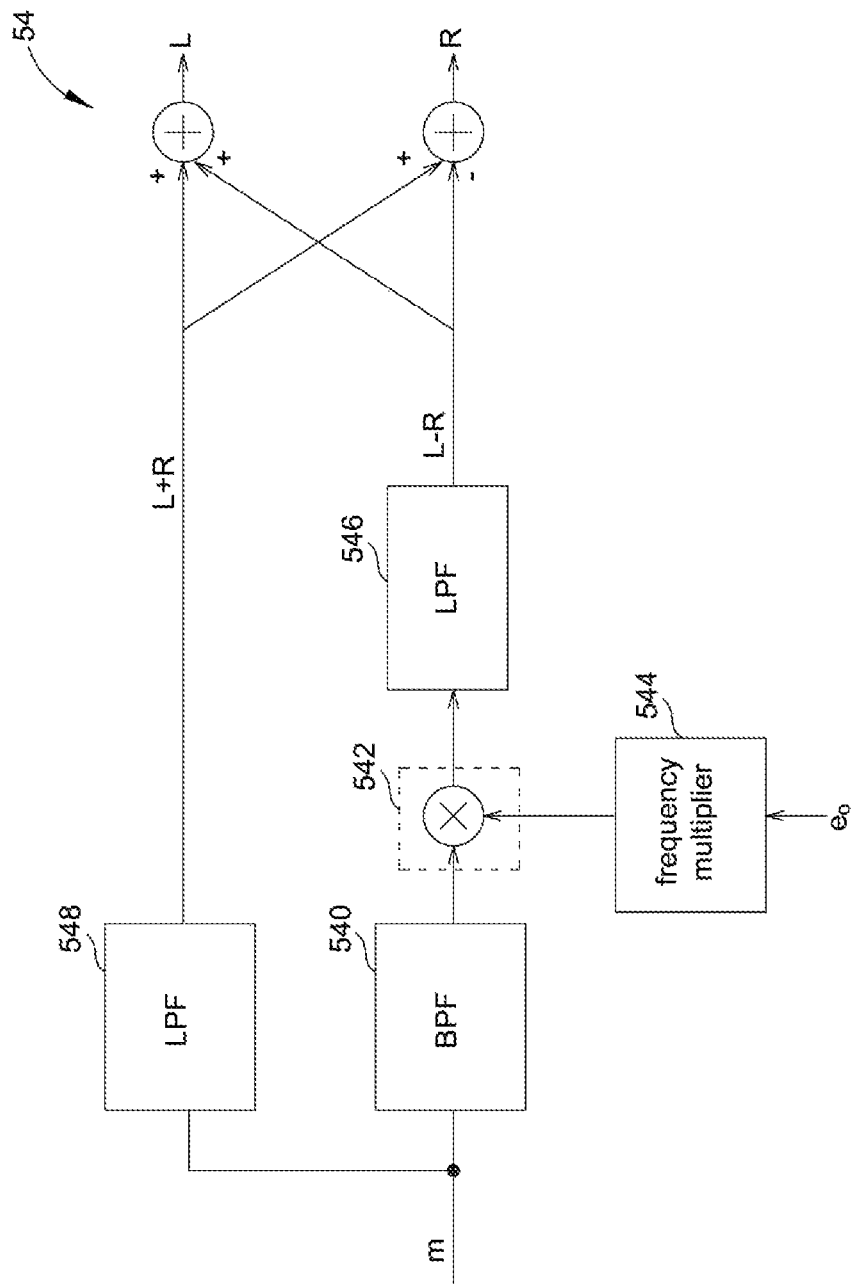
FIG. 10 is a block diagram of a channel separator.

Further, the channel separator 54 may separate the signal m into the left-channel signal L and the right-channel signal R according to the oscillation output signal $e_o$. FIG. 10 shows a block diagram of the channel separator 54. The channel separator 54 filters out the signal $L(t)+R(t)$ in 0 KHz to 15 KHz from the signal m(t) by an LPF 548 to obtain a sum signal L+R. Further, the channel separator 54 filters out the signal $[L(t)-R(t)] \cos(2\pi 2f_p t+2\varphi_p)$ in 23 KHz to 53 KHz from the signal m(t) by a band-pass filter (BPF) 540. Further, the channel separator 54 generates a frequency multiplied signal of the oscillation output signal $e_o$ by a frequency multiplier 544, and relocates $[L(t)-R(t)] \cos(2\pi 2f_p t+2\varphi_p)$ to baseband by a mixer 542 and an LPF 546 to obtain a difference signal L−R. Thus, the channel separator may obtain the left-channel signal L and the right-channel signal R according to the sum signal L+R and the difference signal L−R. It should be noted that, as the oscillation output signal $e_o(t)$ gets closer to the pilot signal $x_p(t)$, the effect of separation between the left-channel signal L and the right-channel signal R generated by the channel separator gets better, i.e. the separation between the left and right channels gets better. The performance of the frequency modulation receiver 5 (i.e., the separation of the left and right channels) is described shortly.

In brief, using the filter circuit 100 having a PID filter structure, the present invention enhances the frequency tracking capability of the PLL circuit 10 and further improves the separation between the left and right channels of the frequency modulation receiver 5.

It should be noted that, the foregoing embodiments are for illustrating concepts of the present invention, and one person skilled in the art may make different modifications without departing from the spirit of the present invention. For example, in the operation process of the PLL circuit 10, the coefficient adjusting circuit 12 adjusts the proportion coefficient $k_p$, the integration coefficient $k_i$ and the differentiation coefficient $k_d$ in two phases. In an alternative embodiment, the coefficient adjusting circuit 12 may also adjust the proportion coefficient $k_p$, the integration coefficient $k_i$ and the differentiation coefficient $k_d$ in multiple phases based on actual conditions during the converging process of the PLL circuit. Given that the PLL circuit 10 adjusts the proportion coefficient $k_p$, the integration coefficient $k_i$ and the differentiation coefficient $k_d$ during the converging process, modifications made thereto are encompassed within the scope of the present invention.

Figure 8:
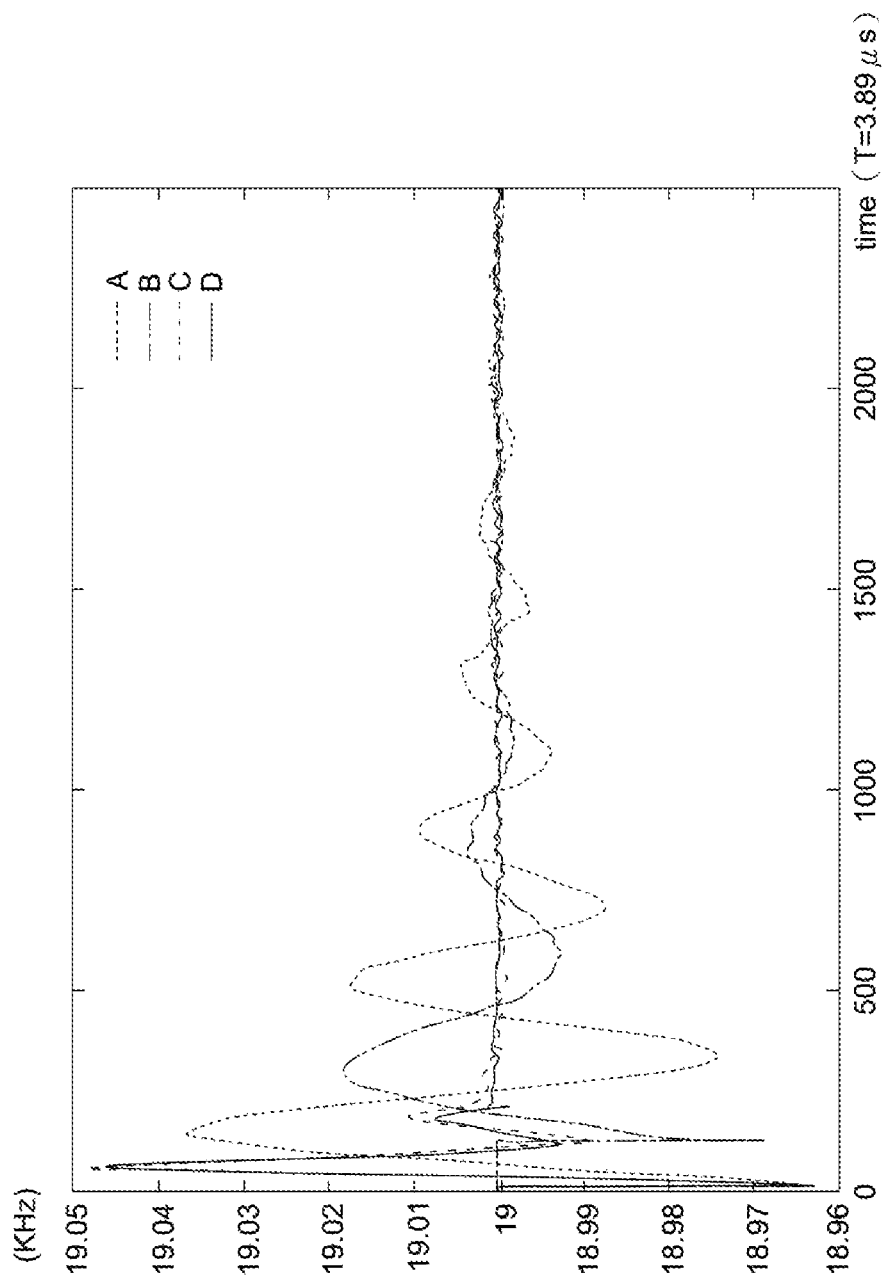
FIG. 8 is a schematic diagram of oscillation frequencies according to an embodiment of the present invention.

The performance of the PLL circuit is given in detail below with reference to Table I and FIG. 8. Table I lists values of the proportion coefficient $k_p$, the integration coefficient $k_i$ and the differentiation coefficient $k_d$, the convergence time of the PLL circuit, and the mean square error of the PLL circuit after the PLL circuit operates for 1500T in scenarios A to D, where T is a time interval that is substantially 3.89 µs. FIG. 8 shows a schematic diagram of the oscillation frequency $f_o$ generated by the VCO 120 in the scenarios A to D (the pilot frequency $f_p$ is 19 KHz).

(requiring only 1500T to converge as opposed to the conventional PLL circuit), and has a lower mean square error compared to the conventional PLL circuit when in a stable state (after the time point 1500T).

In scenario C, between the time point 0 and the time point 200T, the proportion coefficient $k_p$ is 1/32 and the integration coefficient $k_i$ is 1/(1024*4); between the time point 200T and the time point 2500T, the proportion coefficient $k_p$ is reduced to 1/128 and the integration coefficient ki is reduced to 1/(1024*32); the differentiation coefficient $k_d$ is persistently 0 from the time point 0 to the time point 2500T. Similarly, the PLL circuit in scenario C is equivalent to the PLL circuit 700, and the curve of the oscillation frequency $f_o$ corresponding to scenario C in FIG. 8 may represent the frequency tracking performance of the PLL circuit 70 under conditions that the proportion coefficient $k_p$ and the integration coefficient $k_i$ are adjusted. In other words, in the first phase (from the time point 0 to the time 200T), the coefficient adjusting circuit 72 provides the filter circuit 700 with higher proportion coefficient $k_p$ and integration coefficient $k_i$ to accelerate the convergence speed of the PLL circuit 70; in a second phase (from the time point 200T to the time point 2500T), the coefficient adjusting circuit 72 reduces the

TABLE I

| | A | B | C | | D | |
|---|---|---|---|---|---|---|
| Scenario | ∀ | ∀ | | | | |
| | t < 2500T | t < 2500T | t < 200T | t > 200T | t < 200T | t > 200T |
| $k_p$ | 0 | 1/128 | 1/32 | 1/128 | 1/32 | 1/128 |
| $k_i$ | 1/(1024 × 4) | 1/(1024 × 8) | 1/(1024 × 4) | 1/(1024 × 32) | 1/(1024 × 4) | 1/(1024 × 32) |
| $k_d$ | 0 | 0 | 0 | 0 | 1/64 | 1/256 |
| Convergence time | 2500T | 1500T | 600T | | 200T | |
| MSE after 1500T | 7.37e−05 | 3.38e−05 | 2.68e−05 | | 2.5e−05 | |

In scenario A, the integration coefficient $k_i$ is persistently 1(1024*4) from a time point T to a time point 2500T, and the proportion coefficient $k_p$ and the differentiation coefficient $k_d$ are persistently 0 from the time point 0 to the time point 2500T. In the above situation, the filtered output signal $e_v$ contains only the integration result $r_i$. At this point, the effect of the filter circuit in scenario A is equivalent to that of a loop filter of a conventional PLL circuit. The curve of the oscillation frequency $f_o$ corresponding to scenario A in FIG. 8 may represent the frequency tracking performance of a conventional PLL circuit.

In scenario B, the integration coefficient $k_i$ is persistently 1(1024*8) from the time point T to the time point 2500T, the proportion coefficient $k_p$ is persistently 1/128 from the time point T to the time point 2500T, and the differentiation coefficient $k_d$ is persistently 0 from the time point 0 to the time point 2500T. In the above situation, the filtered output signal $e_v$ contains only the proportion result $r_p$ and the integration result $r_i$ but not the differentiation result $r_d$. At this point, the filter circuit in scenario B is equivalent to the filter circuit 700. The curve of the oscillation frequency $f_o$ corresponding to scenario B in FIG. 8 may represent the frequency tracking performance of the PLL circuit 700 under conditions that the proportion coefficient $k_p$ and the integration coefficient $k_i$ are not adjusted. It is seen from Table I and FIG. 8 that, a conventional PLL circuit (scenario A) needs 2500T to have the oscillation frequency $f_o$ converge to the pilot frequency $f_p$. Further, even when the filter circuit 700 includes only the proportion circuit and the integration circuit but not the differentiation circuit (scenario B), the convergence speed of the PLL circuit 70 is faster proportion coefficient $k_p$ and the integration coefficient $k_i$, such that the PLL circuit 70 has a lower mean square error after the time point 1500T. Compared to scenario B, the PLL circuit 70 has a faster convergence speed and a lower mean square error.

Scenario D is similar to scenario C, with differences being that, between the time point 0 and the time point 200T, the differentiation coefficient $k_d$ is 1/64; between the time point 200T and the time point 2500T, the differentiation coefficient $k_d$ is reduced to 1/256. At this point, the PLL circuit in scenario D is equivalent to the PLL circuit 10, and the curve of the oscillation frequency $f_o$ corresponding to scenario D in FIG. 8 may represent the frequency tracking performance of the PLL circuit 700 under conditions that the proportion coefficient $k_p$, the integration coefficient $k_i$ and the differentiation coefficient $k_d$ are adjusted. Because the differentiation result $r_d$ in the filtered output signal $e_v$ is capable of accelerating or alleviating/suppressing the variance in the frequency of the oscillation outputted signal $e_o$ of a next time interval to prevent the frequency of the oscillation output signal $e_o$ from excessively tracking the frequency $f_p$ of the single-tone signal in the signal m that may cause an even longer convergence time, the PLL circuit 10 in scenario D has a faster convergence speed and a lower mean square error compared to the PLL circuit 70 in scenario C.

Further, as opposed to known technologies, the frequency modulation receiver 5 using the filter circuit 100 (having a PID structure) provides better left and right channel separation. A frequency modulation receiver using a conventional PLL circuit (including a loop filter) provides left and right channel separation that is approximately 20 dB, whereas the frequency modulation receiver 5 (including the filter circuit 100 having a PID filter structure) achieves left and right channel separation that is at least 40 dB.

One person skilled in the art can understand that the function units/circuits in FIG. 1 to FIG. 5 and FIG. 7 may be realized or implemented by digital circuits (e.g., RTL circuit) or a digital signal processor (DSP), and associated details are omitted herein.

Figure 9:
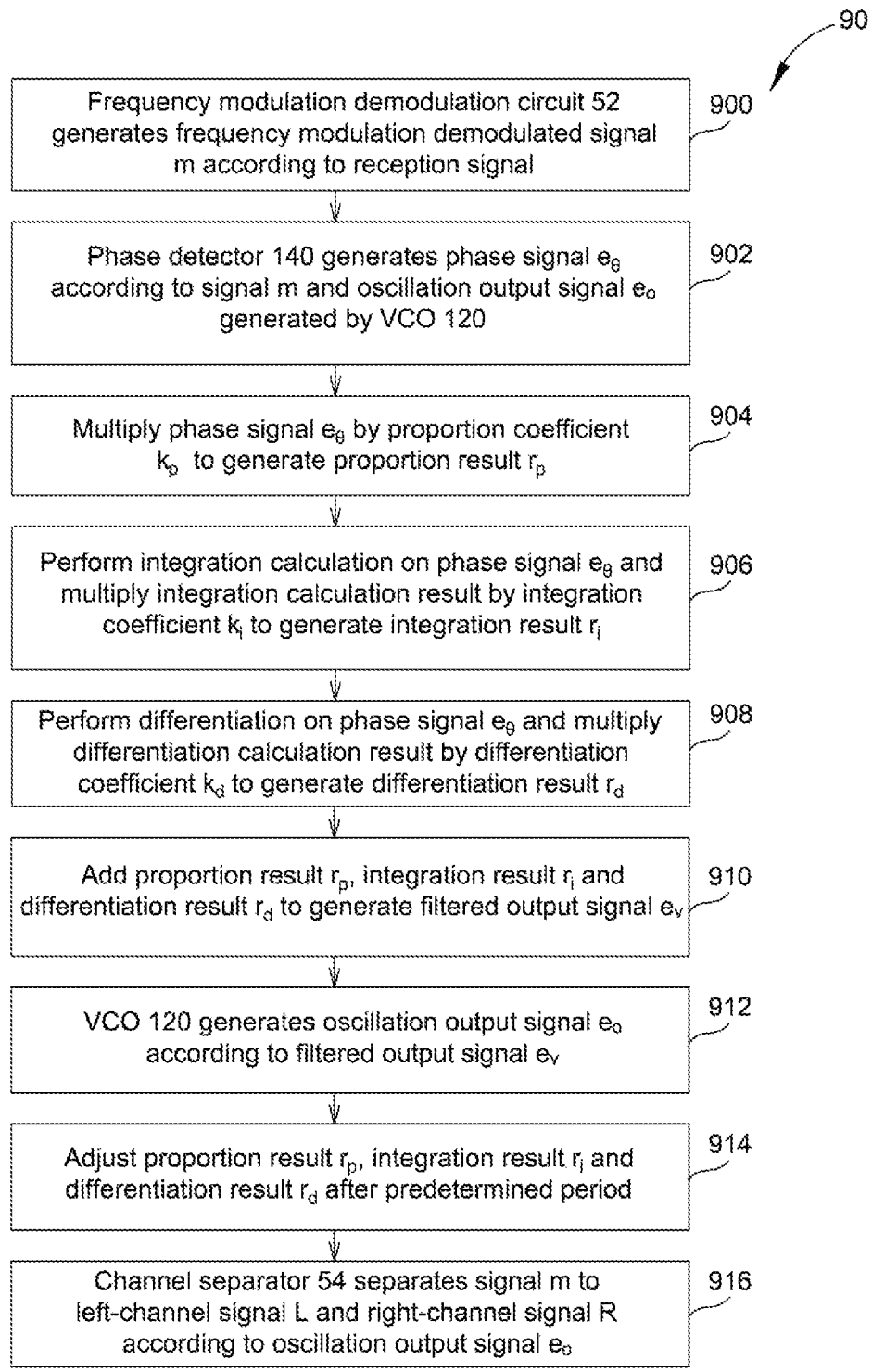
FIG. 9 is a flowchart of a tracking process according to an embodiment of the present invention.

Operation details of the frequency modulation receiver 5 may be concluded into a frequency modulation receiving process. FIG. 9 shows a frequency modulation receiving process 90 according to an embodiment of the present invention. The frequency modulation receiving process 90 may be performed by the frequency modulation receiver 5, and includes following steps.

In step 900, the frequency modulation demodulation circuit 52 generates the frequency modulation demodulated signal m according to the reception signal x.

In step 902, the phase detector 140 generates the phase signal $e_\theta$ according to the signal m and the oscillation output signal $e_o$ generated by the VCO 120.

In step 904, the phase signal $e_\theta$ is multiplied by the proportion coefficient $k_p$ to generate the proportion result $r_p$.

In step 906, an integration calculation is performed on the phase signal $e_\theta$, and the integration calculation result is multiplied by the integration coefficient $k_i$ to generate the integration result $r_i$.

In step 908, a differentiation calculation is performed on the phase signal $e_\theta$, and the differentiation calculation result is multiplied by the differentiation coefficient $k_d$ to generate the differentiation result $r_d$.

In step 910, the proportion result $r_p$, the integration result $r_i$ and the differentiation result $r_d$ are added up to generate the filtered output signal $e_v$.

In step 912, the VCO 120 generates the oscillation output signal $e_o$ according to the filtered output signal $e_v$.

In step 914, after a predetermined period, the proportion result $r_p$, the integration result $r_i$ and the differentiation result $r_d$ are adjusted.

In step 916, the channel separator 54 separates the signal m into the left-channel signal L and the right-channel signal R according to the oscillation output signal $e_o$.

Operation details of the frequency modulation receiving process 90 may be referred from the foregoing paragraphs, and shall be omitted herein.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A frequency modulation receiver, comprising:
    a frequency modulation demodulation circuit, generating a first signal; and
    a first phase locked loop (PLL) circuit, coupled to the frequency modulation demodulation circuit to receive the first signal, the PLL circuit comprising:
        a voltage-controlled oscillator (VCO), generating an oscillation output signal according to a filtered output signal;
        a phase detector, coupled to the VCO, comprising a phase extractor for generating a phase signal according to the oscillation output signal and the first signal; and
        a proportional-integral-derivative (PID) filter, coupled to the VCO and the phase detector, receiving the phase signal and generating the filtered output signal to the VCO, the PID filter comprising:
            a proportion circuit, multiplying the phase signal by a proportion coefficient to generate a proportion result;
            an integration circuit, performing an integration calculation on the phase signal, and multiplying the integration calculation result by an integration coefficient to generate an integration result;
            a differentiation circuit, performing a differentiation calculation on the phase signal, and multiplying the differentiation calculation result by a differentiation coefficient to generate a differentiation result; and
        a summation circuit, generating the filtered output signal according to the proportion result, the integration result and the differentiation result,
    wherein the phase detector comprises:
        a mixer, mixing the first signal with the oscillation output signal to generate a mixed result; and
        a low-pass filter, performing a low-pass filter operation on the mixed result to generate a low-frequency signal,
    wherein the phase extractor extracts a phase of the low-frequency signal to generate the phase signal.

2. The frequency modulation receiver according to claim 1, wherein the integration circuit comprises:
    a first buffer, generating a first buffered output signal; and
    an adder, adding the first buffered output signal with the phase signal to generate an addition result;
    wherein, the first buffer generates the first buffered output signal according to the addition result, and the integration circuit multiplies the addition result by the integration coefficient to generate the integration result.

3. The frequency modulation receiver according to claim 1, wherein the differentiation circuit comprises:
    a second buffer, generating a second buffered output signal according to the phase signal; and
    a subtractor, subtracting the second buffered output signal from the phase signal to generate a subtraction result;
    wherein, the differentiation circuit multiplies the subtraction result by the differentiation coefficient to generate the differentiation result.

4. The frequency modulation receiver according to claim 1, further comprising:
    a coefficient adjusting circuit, adjusting the proportion coefficient, the integration coefficient and the differentiation coefficient after the PLL operates for a predetermined period of time.

5. A frequency modulation receiving method, applied to a frequency modulation receiver to track a frequency or a phase of a single-tone signal of a first signal, the frequency modulation receiver comprising a frequency modulation demodulation circuit and a phase locked loop (PLL) circuit, the PLL circuit comprising a voltage-controlled oscillator (VCO) and a phase detector, the frequency modulation receiving method comprising:
    generating the first signal by the frequency modulation demodulation circuit;
    generating a phase signal according to the first signal and an oscillation output signal that the VCO generates by a phase extractor of the phase detector;
    multiplying the phase signal by a proportion coefficient to generate a proportion result;
    performing an integration calculation on the phase signal, and multiplying the integration calculation result by an integration coefficient to generate an integration result;

performing a differentiation calculation on the phase signal, and multiplying the differentiation calculation result by a differentiation coefficient to generate a differentiation result;

generating the filtered output signal according to the proportion result, the integration result and the differentiation result; and generating the oscillation output signal according to the filtered output signal by the VCO;

wherein, the PLL circuit approximates the frequency or the phase of the single-tone signal according to the oscillation output signal and the step of generating the phase signal according to the first signal and the oscillation output signal comprises:

mixing the first signal with the oscillation output signal to generate a mixed result;

performing a low-pass filter operation on the mixed result to generate a low-frequency signal; and extracting a phase of the low-frequency signal to generate the phase signal.

6. The frequency modulation receiving method according to claim 5, further comprising:

adjusting the proportion coefficient, the integration coefficient and the differentiation coefficient after a predetermined period of time.

* * * * *